(12) United States Patent
Fujimura

(10) Patent No.: US 8,208,309 B2
(45) Date of Patent: Jun. 26, 2012

(54) SEMICONDUCTOR MEMORY DEVICE AND METHOD OF OPERATING THE SAME

(75) Inventor: Susumu Fujimura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 139 days.

(21) Appl. No.: 12/868,196

(22) Filed: Aug. 25, 2010

(65) Prior Publication Data

US 2011/0051518 A1 Mar. 3, 2011

(30) Foreign Application Priority Data

Sep. 2, 2009 (JP) ................................ 2009-203122

(51) Int. Cl.
*G11C 11/34* (2006.01)
*G11C 16/04* (2006.01)
(52) U.S. Cl. .......... 365/185.21; 365/185.12; 365/185.17
(58) Field of Classification Search ............. 365/185.12, 365/185.17, 185.21
See application file for complete search history.

(56) References Cited

U.S. PATENT DOCUMENTS

| | | | |
|---|---|---|---|
| 2004/0186959 A1* | 9/2004 | Kawamoto | 711/132 |
| 2009/0073763 A1 | 3/2009 | Hosono | |
| 2010/0067369 A1* | 3/2010 | Deishi | 370/216 |
| 2010/0302847 A1* | 12/2010 | Komai et al. | 365/185.03 |

FOREIGN PATENT DOCUMENTS

| | | |
|---|---|---|
| JP | 10-116494 | 5/1998 |
| JP | 2005-116102 | 4/2005 |
| JP | 2006-172523 | 6/2006 |
| JP | 2007-323321 | 12/2007 |
| JP | 2009-70501 | 4/2009 |
| WO | WO 2009/035862 A1 | 3/2009 |

OTHER PUBLICATIONS

Japanese Office Action issued Dec. 6, 2011, in Patent Application No. 2009-203122 (with English-language translation).

* cited by examiner

*Primary Examiner* — Ly D Pham
(74) *Attorney, Agent, or Firm* — Oblon, Spivak, McClelland, Maier & Neustadt, L.L.P.

(57) ABSTRACT

A semiconductor memory device, in which flag data read of a flag data region is performed during data write, comprises: a nonvolatile memory cell array having an ordinary data region and the flag data region allocated to a one page range in which read and write are simultaneously performed; and a one page amount of sense amplifiers, each of the sense amplifiers comprising a data latch for retaining write data. During read of the flag data by the sense amplifier circuit, in the case of one of the sense amplifiers corresponding to the flag data region, read flag data is transferred to the data latch. In the case of one of the sense amplifiers corresponding to the ordinary data region, write data retained by the data latch is rewritten regardless of read cell data.

20 Claims, 7 Drawing Sheets

| Pdata | DL1 | TCAP | BL | TCAP or DL1 |
|-------|-----|------|-----|-------------|
| 0 | 0 | 0 | 0 | 0 |
| 1 | 1 | Rdata | Rdata | 1 |

After (f) Read — After (h) Read

FIG. 7

| Circuit Operation | Ordinary Data Region | | | Flag Data Region | | |
|---|---|---|---|---|---|---|
| | DL1 | TCAP | BL | DL1 | TCAP | BL |
| (a) Data load | Pdata | | | X | | |
| (b) program execute command | | | | | | |
| (c) flag set 1 | Pdata | | | 1 | | |
| (d) read (selective BL precharge) | Pdata | | Pdata | 1 | | |
| (e) read (BL discharge) | Pdata | | 0,Rdata | 1 | | 1 |
| (f) read (BL sense) | Pdata | 0,Rdata | 0,Rdata | 1 | RdataF | RdataF |
| (g) read (flag set 0) | Pdata | 0,Rdata | 0,Rdata | 0 | RdataF | RdataF |
| (h) read (TCAP or DL1⇒DL1) | Pdata | Pdata | 0,Rdata | RdataF | RdataF | RdataF |

Pdata: Prog data
Rdata: Read data (ordinary region)
RdataF: Read data (flag region)
X: unknown

SEMICONDUCTOR MEMORY DEVICE AND METHOD OF OPERATING THE SAME

CROSS REFERENCE TO RELATED APPLICATION

This application is based upon and claims the benefit of priority from prior Japanese Patent Application No. 2009-203122, filed on Sep. 2, 2009, the entire contents of which are incorporated herein by reference.

BACKGROUND

1. Field

Embodiments described herein relate to a sense amplifier circuit system allowing for flag read control during write, the sense amplifier circuit system being provided in a semiconductor memory device that includes a nonvolatile memory cell array.

2. Description of the Related Art

NAND flash memories, in which a plurality of electrically rewritable nonvolatile memory cells are connected in series to configure a NAND cell unit (NAND string), are in greater and greater demand due to increasingly large capacity.

In large capacity NAND flash memory of recent years, a flag data region is provided in addition to an ordinary data region, the flag data region employing a method such as one in which, for example, protect information is written to the flag data region and a specific block is set to write prohibit (refer, for example, to JP 2007-323321 A).

In an ordinary write command sequence for a NAND flash memory, a write command input, address input, write data input, and write execute command input are performed in that order, and then, subsequent to the write execute command input and prior to start of an internal write operation, a flag data read operation is performed. In order to realize the above-mentioned protect flag function with such a write command sequence, write data already loaded must be prevented from being destroyed during flag data read.

To render flag data readable while retaining the write data, the sense amplifier needs only be provided with a plurality of data latches, for example.

In the case of a multilevel data storage (MLC: Multi Level Cell) system, the need to retain first page write data and perform second page data write while referring to the first page write data leads to an ordinary sense amplifier being provided with a plurality of data latches (refer, for example, to JP 2009-070501 A). This kind of sense amplifier allows flag data to be read without destroying the write data.

However, in a binary data storage (SLC: Single Level Cell) system, simply put, a sense amplifier has only a single data latch (refer, for example, to JP 2005-116102 A). In the case of such a simple sense amplifier, unless some kind of measure is taken when applying the above-mentioned write command sequence, the write data gets destroyed.

BRIEF DESCRIPTION OF THE DRAWINGS

FIG. 7 is a view showing data change at each of nodes of the sense amplifier for an ordinary data region and a flag data region during the same flag data read.

DETAILED DESCRIPTION OF THE EMBODIMENTS

According to one embodiment, a semiconductor memory device, in which flag data read of a flag data region is performed during data write, comprises: a nonvolatile memory cell array formed from a plurality of nonvolatile memory cells, and having an ordinary data region and the flag data region allocated to a one page range in which read and write are simultaneously performed; and a sense amplifier circuit including a plurality of sense amplifiers, a number of the sense amplifiers corresponding to a number of the nonvolatile cells in a one page amount, and each of the sense amplifiers comprising a data latch for retaining write data. During read of the flag data by the sense amplifier circuit, in the case of one of the sense amplifiers corresponding to the flag data region, read flag data is transferred to the data latch. In the case of one of the sense amplifiers corresponding to the ordinary data region, write data retained by the data latch is rewritten regardless of read cell data.

An embodiment of the present invention is described below with reference to the drawings.

Figure 1:
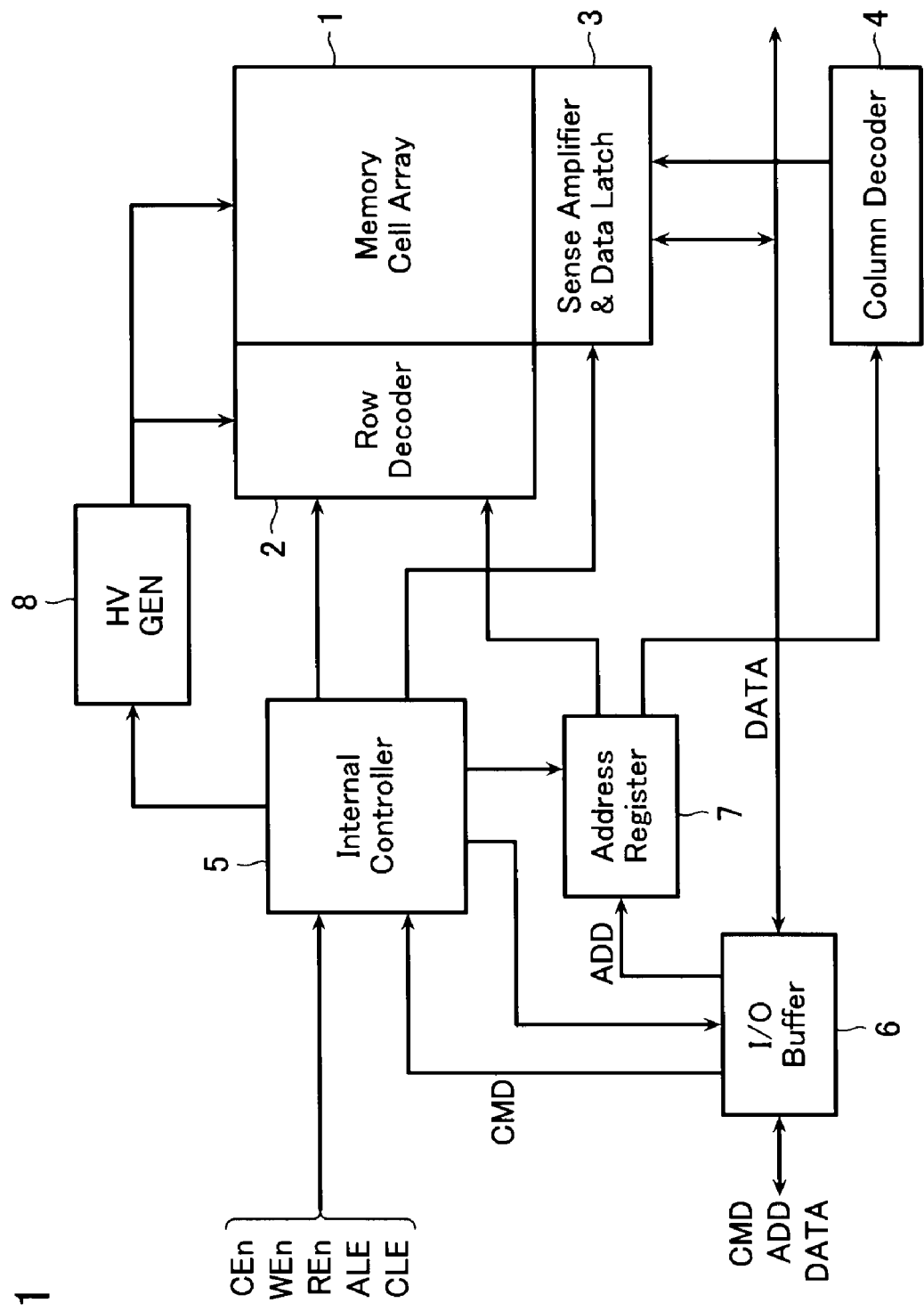
FIG. 1 is a view showing a configuration of a NAND flash memory in accordance with an embodiment of the present invention.
Figure 2:
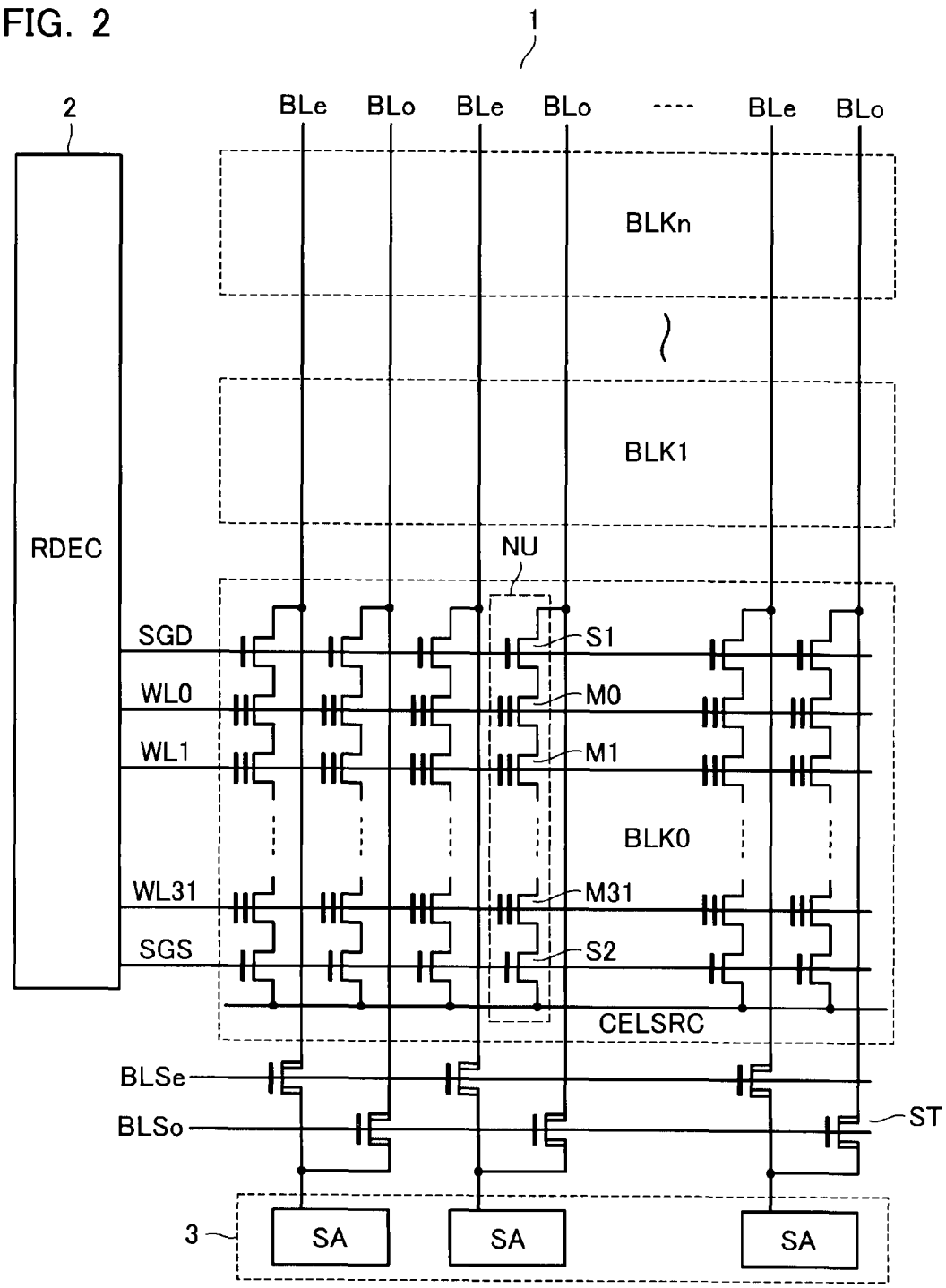
FIG. 2 is a view showing a memory cell array in the same flash memory.

FIG. 1 is a schematic view of an overall configuration of a NAND flash memory in accordance with an embodiment, and FIG. 2 shows an equivalent circuit diagram of a memory cell array 1 in the NAND flash memory of the embodiment. A NAND cell unit (NAND string) NU, which is a basic unit of the NAND flash memory, is based on a plurality of memory cells M0-M31 connected in series, and two select transistors S1 and S2 disposed one at each end of the plurality of memory cells M0-M31.

The NAND string NU has one end connected via the select transistor S1 to a bit line BL (BLe or BLo), and the other end connected via the select transistor S2 to a common source line CELSRC within the memory cell array 1.

Each of the memory cells is for example a MOS transistor including an N-type source/drain diffusion layer and a stacked gate, the stacked gate comprising a floating gate, which acts as a charge storage layer, and a control gate. Changing a charge amount retained in the floating gate by a write operation and an erase operation causes a threshold of the memory cell to change, thereby storing data in a nonvolatile manner.

The control gates of the memory cells within the NAND string NU are each connected to a separate one of word lines WL0-WL31, and gates of the select gate transistors S1 and S2 are connected to select gate lines SGD and SGS, respectively.

An assembly of NAND strings sharing the word lines WL0-WL31 and the select gate lines SGD and SGS configures a block BLK which is unit of data block erase. Generally, a plurality of blocks BLK0, BLK1, ..., BLKn are arranged in a bit line direction as shown in FIG. 2.

A row decoder 2 selects a block in accordance with an address, and selectively drives the word lines WL0-WL31 and the select gate lines SGD and SGS in the selected block.

A sense amplifier circuit 3 includes a one page amount of sense amplifiers S/A. Read/write data is transferred in one lot in one page units between the sense amplifier circuit 3 and the memory cell array 1. A column decoder 4 selects such read/write data one column at a time. This allows serial data transfer to be performed between the sense amplifier circuit 3 and external I/O terminals for read/write data DATA.

In the NAND flash memory, a variety of operations are realized together with input of a command CMD. The command CMD is loaded into an internal controller 5 via an I/O buffer 6 to be decoded and used in circuit operation control. The internal controller 5 is controlled by external control signals (chip enable CEn, write enable WEn, read enable REn, address latch enable ALE, command latch enable CLE, and so on) and the command CMD applied from a data IO terminal to perform internal operation control of write, read, and erase.

An address ADD is loaded into an address register 7 via the I/O buffer 6, to be transferred to the row decoder 2 and the column decoder 4, thereby performing an address selection.

A high voltage generating circuit 8 is controlled by the internal controller 5 to generate a high voltage (boost voltage) such as a write voltage, a write pass voltage, a read pass voltage, and the like, required in the row decoder 2 and sense amplifier circuit 3.

FIG. 2 shows an example where an even-numbered bit line BLe and an adjacent odd-numbered bit line BLo share a single sense amplifier SA. During write or read, the even-numbered bit line BLe and the odd-numbered bit line BLo are selectively connected to the sense amplifier SA by a select transistor ST driven by select signals BLSe and BLSo. At this time, an unselected bit line functions as a shield line, thereby preventing interference between bit lines.

In the case of this sense amplifier system, the memory cells selected by one word line and all even-numbered bit lines BLe configure one page (an even page) which is the unit of simultaneous write or read. In addition, the memory cells selected by one word line and all odd-numbered bit lines BLo configure one page (an odd page) which is the unit of simultaneous write or read.

Figure 3:
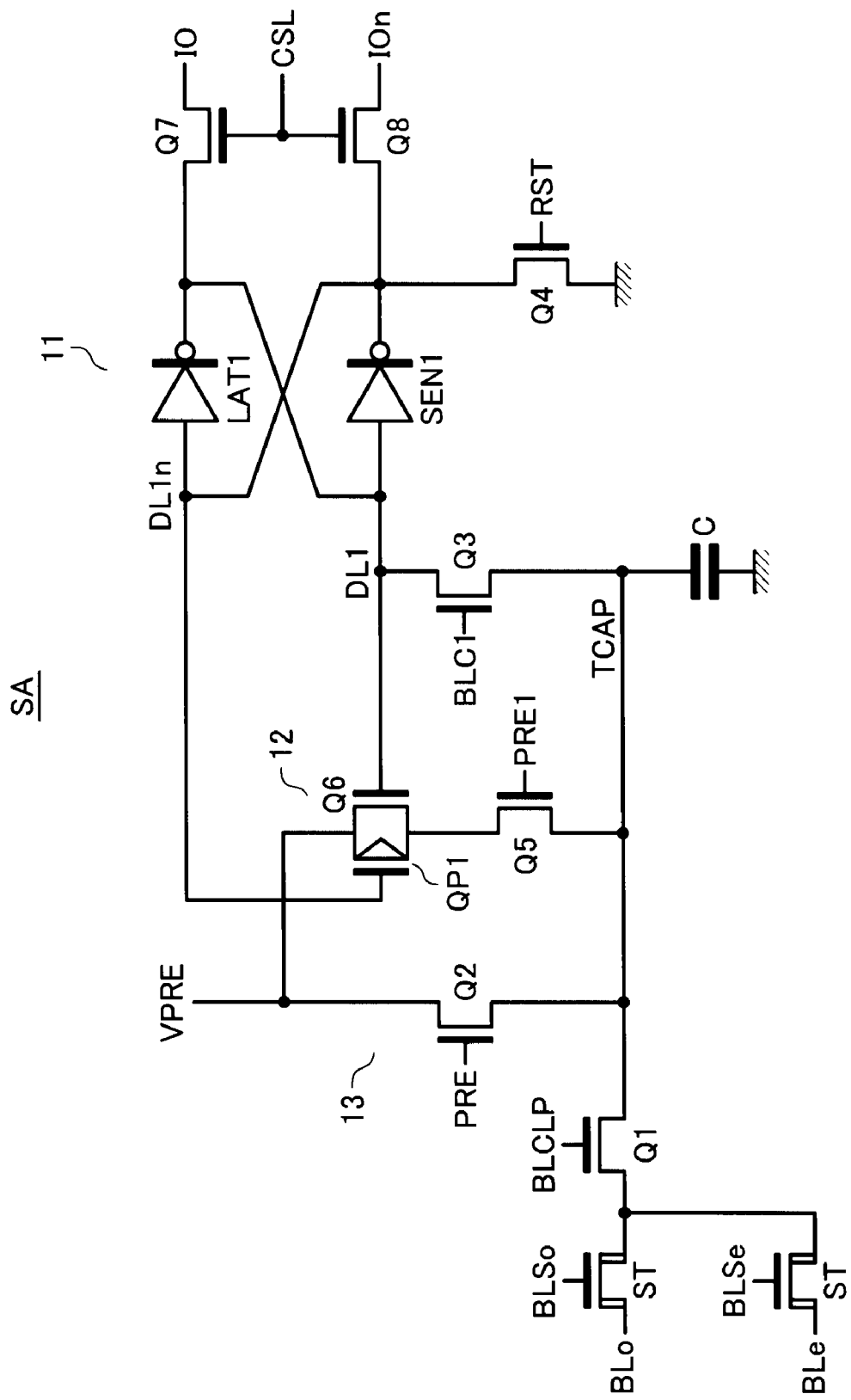
FIG. 3 is a view showing a sense amplifier in the same flash memory.

FIG. 3 shows a configuration example of one of the sense amplifiers SA. A node TCAP is a sense node and is connected via a clamp NMOS transistor Q1 and the bit line select transistor ST to the bit line BLe (or BLo). The bit line select transistor ST is a high voltage transistor.

The sense node TCAP grounded via a capacitor C is connected via a transfer NMOS transistor Q3 to a data node DL1 of a data latch 11. The data latch 11 is for retaining write/read data and is configured as clocked inverters having inputs and outputs cross-connected.

The data node DL1 and a data node DL1n of the data latch 11 are connected via NMOS transistors Q7 and Q8 driven by a column select signal CSL to data lines IO and IOn. The data node DL1n is connected to a reset NMOS transistor Q4.

The sense node TCAP has a source of a precharge NMOS transistor Q2 connected thereto, a drain of the precharge NMOS transistor Q2 being connected to a voltage supply terminal (VPRE). This configures a precharge circuit 13 for performing a bit line precharge during read.

Connected in series between the VPRE terminal and the sense node TCAP are a CMOS switch and a transfer transistor Q5. The CMOS switch is configured by an NMOS transistor Q6 and PMOS transistor QP1 controlled respectively by the data nodes DL1 and DL1n of the data latch 11. The transfer transistor Q5 is driven by a control signal PRE1. This part configures a write back circuit 12 for performing a data write back of the data latch 11 by OR logic between retained data of the data latch 11 and read data of the sense node TCAP.

Figure 4:
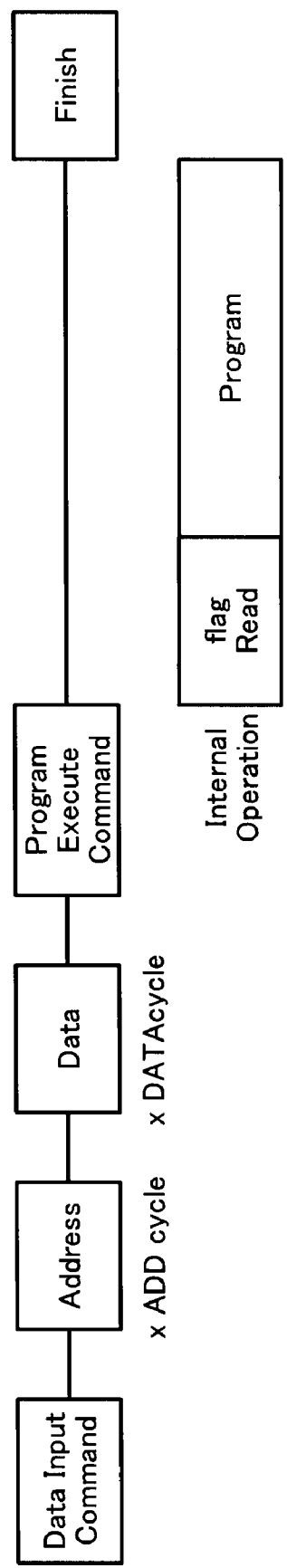
FIG. 4 is a view showing a write command sequence in the same flash memory.

FIG. 4 shows a command sequence during data write. During write, a data input command is first inputted; then the address and write data are sequentially inputted; next, a write execute command is inputted. This causes a write operation to be automatically performed by sequence control of the internal controller 5. A specific internal operation includes a flag data read operation performed prior to the write operation. Write and read of the cell array is performed in page units.

Figures 5, 8:
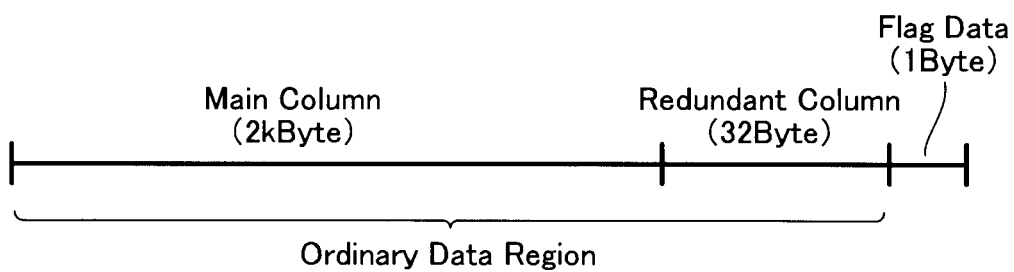
FIG. 5 is a view showing a one page data configuration in the same flash memory.
FIG. 8 is a truth table showing the way write data Pdata is retained during the same flag data read.

FIG. 5 shows an example of column configuration of one page of data in the flash memory. One page is provided with a main column of, for example, 2 k Bytes, and in addition a redundant column of, for example, 32 Bytes of ECC data or the like. Apart from this ordinary (data) region, there is further provided a flag (data) region of, for example, 1 Byte, for retaining flag data.

The flag data region cannot be write accessed in the same way as the ordinary data region, but is configured such that a specific command sequence allows it to be written with protect information of a specific block designated by a user.

As previously mentioned, in the cell array, one page within a block is simultaneously read or written. However, in order to apply the write command sequence shown in FIG. 4, it becomes necessary that a flag data read can be performed without destroying the write data retained in the sense amplifier circuit.

Even though the sense amplifier SA of the present embodiment is a simple one having a single data latch, a logical operation utilizing the write back circuit 12 during flag data read allows control such that the write data retained by the data latch in the ordinary data region is renewed as is, that is, rewritten, and, moreover, allows control such that the flag data in the flag data region is read.

The flag data read operation is described specifically below.

Figure 6:
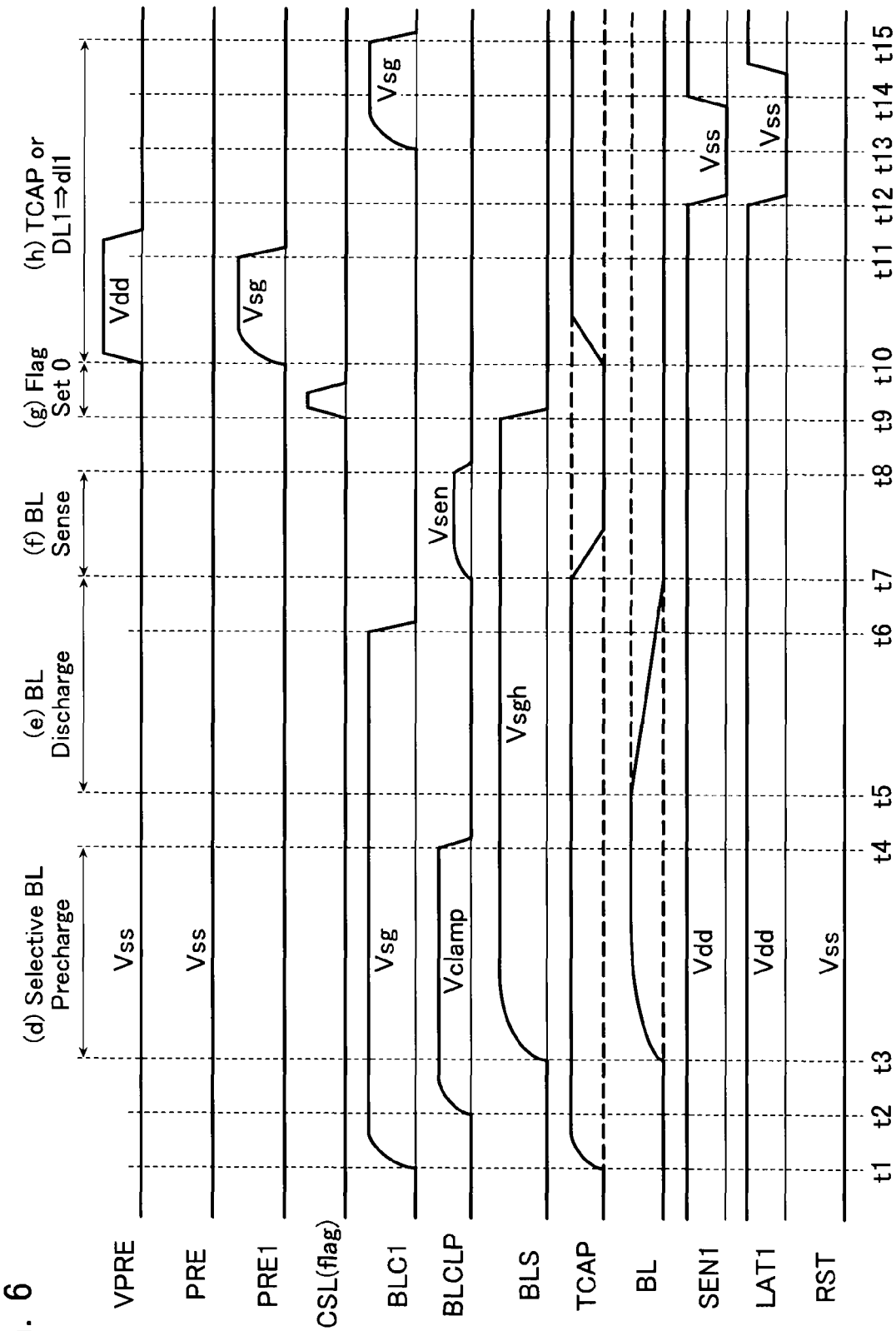
FIG. 6 is a timing chart of a flag data read operation in the same flash memory.

FIG. 6 is a timing chart of the flag data read operation, and FIG. 7 shows a data state at main nodes (the data node DL1, the sense node TCAP, and the bit line BL) in each of the operation steps for the ordinary data region and the flag data region.

In FIG. 7, "Pdata" is write data loaded into the sense amplifier SA, "Rdata" is cell data read in the ordinary data region by the flag data read operation, and "RdataF" is cell data read similarly in the flag data region, that is, flag data.

FIG. 8 is a truth table showing that the "0" and "1" of the write data Pdata retained by the data latch 11 is renewed as is by the flag data read operation for the ordinary data region. Data in the Pdata column and the DL1 column show the loaded write data Pdata. The TCAP and BL columns show states of the sense node TCAP and bit line BL as a result of an (f) read (bit line sense) operation. The cell data Rdata shows read data of a cell corresponding to a precharged bit line, that is, Rdata="0" or "1". In addition, FIG. 8 shows a non-precharged bit line BL and corresponding sense node TCAP in the ordinary data region as still being 0. The TCAP or DL1 column shows a data state of the data node DL1 as a result of a final (h) read.

As shown in FIG. 7, an (a) write data load causes one page of write data Pdata to be loaded via data lines IO and IOn into the data latches 11 of each of the sense amplifiers SA. At this time the data latches of the flag data region are X (unknown).

Subsequent to this data load, when a (b) write execute command is inputted, the sequence control of the internal controller 5 causes the flag data read operation to be automatically performed. Specifically, a (c) flag set 1 is performed, and subsequent flag read operations of (d)-(h) are performed. The (d)-(h) indicating circuit operations in FIG. 6 correspond to the (d)-(h) of FIG. 7.

The (c) flag set 1 is an operation for setting control data "1" (DL1=Vdd) in the data latch of the sense amplifier SA in the flag data region. The (c) flag set 1 is performed prior to timing t1 in FIG. 6, and therefore omitted from FIG. 6. The setting control data "1" causes the bit line in the flag data region to be precharged for flag read.

In a (d) read (selective bit line precharge) operation, data of the data node DL1 is transferred to the sense node TCAP, whereby bit line precharge via the clamp transistor Q1 is selectively performed. Specifically, as shown in FIG. 6, at timing t1, a voltage Vsg (gate voltage at which Vdd can be transferred without a drop in Vth) is applied to gate BLC1 of the transfer transistor Q3, at timing t2, gate BLCLP of clamp transistor Q1 is raised to a voltage Vclamp (0.6+Vth, if bit line charge voltage is assumed to be 0.6 V), and at timing t3, gate BLSe (or BLSo) of the select transistor ST is raised to a voltage Vsgh (voltage at which Vdd can be transferred without a drop in Vth).

As a result, in the flag data region, a bit line precharge is performed based on control data (DL1="1" (=Vdd)) set in (c) flag set 1. In the ordinary data region, a precharge is performed only on bit lines where Pdata="1" (=Vdd).

The next operation, namely an (e) read (bit line discharge) operation, is a bit line discharge operation according to cell data of a selected page. That is, the bit line is discharged according to data of the selected cell in a state where a selected word line is applied with 0 V and an unselected word line is applied with a read pass voltage. In this operation, the sense amplifier is separated. When the selected memory cell is on, the bit line is discharged, and when off is not discharged, whereby the cell data appears in the bit line BL.

In the ordinary data region, in bit lines where the write data Pdata is "1", the cell data Rdata (0 or 1) is read, and the bit lines where the write data Pdata is "0" are left uncharged at 0 V (Vss). In the flag data region, bit line precharge is performed due to DL1="1", and the flag data RdataF (0 or 1) is therefore read.

The next operation, namely an (f) read (bit line sense) operation, is an operation for sensing a bit line potential using a capacitance of the sense node TCAP. That is, at timing t7, a sense voltage Vsen (for example, Vsen=0.5+Vth, when the bit line is sensed with 0.5 V) is applied to the gate of the clamp transistor Q1.

When the bit line has discharged from a precharge level to become 0.5 V or less, the transistor Q1 is turned on, and the sense node TCAP is discharged to the same potential as the bit line. When the bit line is 0.5 V or more, the transistor Q1 is off, and the sense node TCAP remains at voltage Vdd.

The next operation, namely a (g) read (flag set 0) operation, is an operation for setting control data "0" (DL1=Vss) in the data latch of the sense amplifiers SA in the flag data region. Specifically, for the flag data region, the column select signal CSL is set to "1", and the sense amplifiers of the flag data region only are set to DL1=Vss via the data lines IO and IOn.

This forms control data for keeping the write back circuit 12 in the flag data region turned off in the next operation, and for transferring the flag data read to the sense node TCAP as is to the data latch. At this time, in the ordinary data region, the write back circuit 12 is turned on or off according to the write data Pdata, leading to the write data being rewritten to the data latch.

That is, the next operation, namely an (h) read operation, is an operation for performing an OR logical operation between the data node DL1 and the sense node TCAP and for transferring a result of the OR logical operation to the data latch in order to reproduce the write data Pdata of the ordinary data region.

At timing t10, the terminal VPRE is raised to voltage Vdd, and the control signal PRE1 is raised to voltage Vsg thereby turning on the transfer transistor Q5 of the write back circuit 12. When the data node DL1 is "0" (=Vss), the transistors Q6 and QP1 of the write back circuit 12 are turned off, and the data of the sense node TCAP cannot be rewritten. When the data node DL1 is "1" (=Vdd), the write back circuit 12 is turned on, and the sense node TCAP is overwritten with "1".

The write data Pdata can thus be obtained at the sense node TCAP as the result of the OR logical operation between the sense node TCAP and the data node DL1. At timing t12, SEN1 and LAT1 are lowered to turn off the clocked inverter of the latch. When, at timing t13, BLC1 is raised to voltage Vsg to switch on the transfer transistor Q3, the data of the sense node TCAP is transferred to the data node DL1. At timing t14, the latch is completed by turning on the clocked inverter in the order of SEN1 followed by LAT1.

As shown in FIG. 8, in the ordinary data region, the result of the OR logical operation between the sense node TCAP and the data node DL1 is "0" in the case that the write data Pdata is "0", and is "1" in the case that the write data Pdata is "1", irrespective of read cell data. This results in the write data Pdata being stored intact.

In contrast, in the flag data region, the result of the OR logical operation between the sense node TCAP and the data node DL1 is the flag data RdataF. That is, since the control data (DL1="0") keeps the write back circuit 12 turned off, the flag data RdataF, which is the read data of the sense node TCAP, is transferred as is to the data latch.

As described above, the flag data read operation in accordance with the embodiment allows flag read to be realized without destroying previously inputted write data, while using a simple sense amplifier having a single data latch.

Provided that the read protect information is not "1" (write prohibit), the write operation is performed based on the loaded write data Pdata. The operations for write and write verify are described simply as follows.

The write operation is performed by repetition of a write pulse voltage application and a write verify operation, the write verify operation being to confirm a write state. First, a channel potential of the NAND string is set via a selected bit line in accordance with the write data Pdata. Subsequently, a selected word line is applied with a write voltage Vpgm, and an unselected word line is applied with a write pass voltage. As a result, in a "0" write cell in the selected word line, the floating gate is injected with electrons thereby raising the threshold. In a "1" write cell (write prohibit cell), a floating state channel is boosted whereby electron injection is not performed. Unselected cells in the unselected word line are also subject to channel control such that the channel is boosted and write prevented.

In a write verify read, a bit line corresponding to a cell where "0" write is performed retains the bit line potential precharged beforehand, and a bit line corresponding to a cell where "1" write is performed and to a cell where "0" write is insufficient is discharged. When this is sensed by the sense node TCAP and transferred to the data latch 11, only the data latch corresponding to a "0" write insufficient cell becomes "0" data again. The bit line corresponding to the "1" write cell is discharged, but reading with the write back circuit 12 turned on causes the "1" data to be reproduced.

This allows the write operation and write verify to be repeated only on the "0" write insufficient cell. When all the "0" writes become sufficient, the data latch 11 becomes all "1", this is detected, and the write is thus completed.

The sense amplifier SA having the single latch shown in FIG. 3 is merely one example. Provided that an operation substantially the same as the flag data read operation described in the above embodiment can be realized, the write back circuit 12 and so on may be appropriately changed, for example.

In addition, the (g) read (flag set 0) operation shown in FIG. 7 may be performed concurrently with the (f) read (bit line sense) operation, for example.

Furthermore, the case is described in the embodiment where the flag data is 1 Byte (=1 column), but the flag data region may be a plurality of columns. In that case, the (g) read (flag set 0) operation of FIG. 6 becomes an operation where the flags are set by sequentially raising the column select signal CSL for the plurality of columns.

While a certain embodiment has been described, this embodiment has been presented by way of example only, and is not intended to limit the scope of the invention. Indeed, the novel embodiment described herein may be embodied in a variety of other forms; furthermore, various omissions, substitutions and changes in the form of the embodiment described herein may be made without departing from the spirit of the invention. The accompanying claims and their equivalents are intended to cover such forms or modifications as would fall within the scope and spirit of the invention.

What is claimed is:

1. A semiconductor memory device, in which flag data read of a flag data region is performed during data write, comprising:
    a nonvolatile memory cell array formed from a plurality of nonvolatile memory cells, and having an ordinary data region and the flag data region allocated to a one page range in which read and write are simultaneously performed; and
    a sense amplifier circuit including a plurality of sense amplifiers, a number of the sense amplifiers corresponding to a number of the nonvolatile cells in a one page amount, and each of the sense amplifiers comprising a data latch for retaining write data,
    wherein, during read of the flag data by the sense amplifier circuit, in the case of one of the sense amplifiers corresponding to the flag data region, read flag data is transferred to the data latch, and in the case of one of the sense amplifiers corresponding to the ordinary data region, write data retained by the data latch is rewritten regardless of read cell data.

2. The semiconductor memory device according to claim 1, wherein
    each of the sense amplifiers of the sense amplifier circuit further comprises:
    a sense node selectively connected to a bit line of the nonvolatile memory cell array and the data latch; and
    a write back circuit for writing back the write data retained by the data latch, the write back circuit being connected to the sense node,
    and wherein
    a flag data read operation by the sense amplifier circuit is performed, in which:
    (1) in the one of the sense amplifiers corresponding to the ordinary data region, the bit line is selectively precharged according to the write data retained by the data latch, and, simultaneously, in the one of the sense amplifiers corresponding to the flag data region, the bit line is precharged by first control data set in the data latch;
    (2) next, a cell data read operation is performed by the precharged bit line;
    (3) subsequent to or concurrent with the cell data read operation, second control data configured to switch off the write back circuit is set in the data latch of the one of the sense amplifiers corresponding to the flag data region; and
    (4) then, in the one of the sense amplifiers corresponding to the ordinary data region, an operation is performed by the write back circuit to write back the write data retained by the data latch, and, simultaneously, in the one of the sense amplifiers corresponding to the flag data region, an operation is performed to transfer read flag data of the sense node to the data latch.

3. The semiconductor memory device according to claim 2, wherein
    the write back circuit includes a CMOS switch, the CMOS switch having one end connected to a voltage supply terminal and the other end connected via a first transfer transistor to the sense node and having two gate terminals controlled simultaneously by two data nodes of the data latch.

4. The semiconductor memory device according to claim 2, wherein
    each of the sense amplifiers further comprises:
    a bit line precharge circuit having a precharge transistor, the precharge transistor having one end connected to a voltage supply terminal and the other end connected to the sense node and being driven by a control signal; and
    a second transfer transistor interposed between the data latch and the sense node.

5. The semiconductor memory device according to claim 2, wherein
    in the sense amplifier circuit corresponding to the ordinary data region, a logical operation is executed between the cell data read by the cell data read operation and the write data retained by the data latch, and an operation is executed to rewrite the write data on the basis of a result of the logical operation, and
    in the sense amplifier circuit corresponding to the flag data region, a logical operation is executed between the cell data read by the cell data read operation and the second control data, data of a result of the logical operation being transferred to the data latch as the read flag data.

6. The semiconductor memory device according to claim 1, wherein
    the nonvolatile memory cell array has the plurality of nonvolatile memory cells connected in series to configure a NAND string.

7. The semiconductor memory device according to claim 2, wherein
    a single one of the sense amplifiers is shared by adjacent two bit lines.

8. The semiconductor memory device according to claim 1, wherein
    authorization/prohibition of the data write to the nonvolatile memory cell array is controlled by the read flag data.

9. A semiconductor memory device, comprising:
    a memory cell array configured as an arrangement of NAND cell units, each of the NAND cell units being formed having a plurality of nonvolatile memory cells connected in series;
    a word line commonly connected to control gate electrodes of a plurality of the nonvolatile memory cells;
    a bit line connected to a first end of the NAND cell unit;
    a source line connected to a second end of the NAND cell unit; and
    a sense amplifier circuit for controlling a data write operation, the data write operation setting data of the nonvolatile memory cells to a certain threshold voltage distribution state, wherein
the plurality of nonvolatile memory cells connected to a single word line configure one page, which one page is a range in which data write or read operations are executed simultaneously, and have an ordinary data region and a flag data region allocated to the range of the one page, the ordinary data region having ordinary data stored therein, and the flag data region having flag data for controlling authorization/prohibition of the data write stored therein,
wherein the sense amplifier circuit includes:
a plurality of sense amplifiers, a number of the sense amplifiers corresponding to a number of the nonvolatile memory cells configuring the one page;
a data latch for retaining write data to be written to the nonvolatile memory cells and read data read from the nonvolatile memory cells;
a sense node provided within each of the sense amplifiers, the sense node being selectively connected to the bit line and the data latch; and
a write back circuit for writing the write data retained by the data latch, the write back circuit being connected to the sense node,
and wherein, during the data write operation, the sense amplifier circuit retains the write data in the data latch corresponding to the ordinary data region; reads the data retained by the nonvolatile memory cells provided in the ordinary data region and the flag data region; transfers the flag data read from the flag data region to the data latch, and retains the write data of the data latch corresponding to the ordinary data region regardless of cell data read from the ordinary data region; and uses the write back circuit corresponding to the ordinary data region to write the write data to the nonvolatile memory cells.

10. The semiconductor memory device according to claim 9, wherein, during the data write operation, the sense amplifier circuit
uses one of the sense amplifiers corresponding to the ordinary data region to selectively execute a bit line precharge according to the write data retained by the data latch, and uses one of the sense amplifiers corresponding to the flag data region to execute a bit line precharge by first control data set in the data latch; utilizes the precharged bit line to read the data retained by the nonvolatile memory cells provided in the ordinary data region and the flag data region; sets second control data in the data latch corresponding to the flag data region, the second control data being configured to switch off the write back circuit; and uses the one of the sense amplifiers corresponding to the flag data region to transfer the read flag data of the sense node to the data latch, and uses the write back circuit within the one of the sense amplifiers corresponding to the ordinary data region to write the write data retained by the data latch to the nonvolatile memory cells.

11. The semiconductor memory device according to claim 9, wherein
the write back circuit includes a CMOS switch, the CMOS switch having one end connected to a voltage supply terminal and the other end connected via a first transfer transistor to the sense node and having two gate terminals controlled simultaneously by two data nodes of the data latch.

12. The semiconductor memory device according to claim 9, wherein
each of the sense amplifiers further comprises:

a bit line precharge circuit having a precharge transistor, the precharge transistor having one end connected to a voltage supply terminal and the other end connected to the sense node and being driven by a control signal; and
a second transfer transistor interposed between the data latch and the sense node.

13. The semiconductor memory device according to claim 9, wherein
in the sense amplifier circuit corresponding to the ordinary data region, a logical operation is executed between the cell data read by the cell data read operation and the write data retained by the data latch, and an operation is executed to rewrite the write data on the basis of a result of the logical operation, and
in the sense amplifier circuit corresponding to the flag data region, a logical operation is executed between the cell data read by the cell data read operation and the second control data, data of a result of the logical operation being transferred to the data latch as the read flag data.

14. The semiconductor memory device according to claim 9, wherein
a single one of the sense amplifiers is shared by adjacent two bit lines.

15. The semiconductor memory device according to claim 10, wherein
the second control data is set in the data latch corresponding to the flag data region concurrently with the cell data read operation.

16. The semiconductor memory device according to claim 10, wherein
the second control data is set in the data latch corresponding to the flag data region subsequent to the cell data read operation.

17. A method of operating a semiconductor memory device, the semiconductor memory device being one in which flag data read of a flag data region is performed during data write and including a nonvolatile memory cell array formed from a plurality of nonvolatile memory cells, and having an ordinary data region and the flag data region allocated to a one page range in which read and write are simultaneously performed, and a sense amplifier circuit including a plurality of sense amplifiers, a number of the sense amplifiers corresponding to a number of the nonvolatile cells in a one page amount, and each of the sense amplifiers comprising a data latch for retaining write data, the method comprising:
during read of flag data by the sense amplifier circuit,
using one of the sense amplifiers corresponding to the flag data region to transfer read flag data to the data latch; and
using one of the sense amplifiers corresponding to the ordinary data region to rewrite the write data retained by the data latch regardless of read cell data.

18. The method of operating a semiconductor memory device according to claim 17,
wherein each of the sense amplifiers of the sense amplifier circuit further comprises: a sense node selectively connected to a bit line of the nonvolatile memory cell array and the data latch; and a write back circuit for writing back the write data retained by the data latch, the write back circuit being connected to the sense node,
the method further comprising a flag data read operation by the sense amplifier circuit, including:
(1) using the one of the sense amplifiers corresponding to the ordinary data region to selectively precharge the bit line according to the write data retained by the data latch, and using the one of the sense amplifiers corresponding to the flag data region to precharge the bit line by first control data set in the data latch;

(2) performing a cell data read operation by the precharged bit line;

(3) setting second control data in the data latch of the one of the sense amplifiers corresponding to the flag data region, the second control data being configured to switch off the write back circuit; and (4) using the write back circuit in the one of the sense amplifiers corresponding to the ordinary data region to write back the write data retained by the data latch, and using the one of the sense amplifiers corresponding to the flag data region to transfer read flag data of the sense node to the data latch.

19. The method of operating a semiconductor memory device according to claim 18, further comprising:

using the sense amplifier circuit corresponding to the ordinary data region to execute a logical operation between the cell data read by the cell data read operation and the write data retained by the data latch, and rewrite the write data on the basis of a result of the logical operation; and using the sense amplifier circuit corresponding to the flag data region to execute a logical operation between the cell data read by the cell data read operation and the second control data, and transfer data of a result of the logical operation to the data latch as the read flag data.

20. The method of operating a semiconductor memory device according to claim 18, wherein (3) setting second control data is performed concurrently with (2) performing a cell data read operation.

* * * * *